United States Patent
Melchior

[11] 3,943,453
[45] Mar. 9, 1976

[54] HIGH VOLTAGE RAPID SWITCHING CIRCUIT

[75] Inventor: Gerald Melchior, Paris, France

[73] Assignee: Compagnie Industrielle des Telecommunications Cit-Alcatel, France

[22] Filed: Feb. 20, 1974

[21] Appl. No.: 444,190

[30] Foreign Application Priority Data
Feb. 20, 1973 France .............. 73.05915

[52] U.S. Cl. ............... 328/123; 328/67; 307/293; 320/1
[51] Int. Cl.² ............... H03K 17/00; G11C 11/26
[58] Field of Search .............. 328/123, 64, 67, 123; 315/13, 26; 313/92 PF; 172/5.4 P, 5.4 E; 307/293

[56] References Cited
UNITED STATES PATENTS

| | | | |
|---|---|---|---|
| 2,257,942 | 10/1941 | Farnsworth | 328/123 |
| 3,697,880 | 10/1972 | Melchior et al. | 328/123 |
| R24,070 | 10/1955 | Pierce | 328/123 |

Primary Examiner—Stanley D. Miller, Jr.
Assistant Examiner—B. P. Davis
Attorney, Agent, or Firm—Craig & Antonelli

[57] ABSTRACT

A high voltage rapid switching circuit having a capacity in relation to ground and on a charge from a switchable voltage generator, includes a reactive power supplement circuit constituted by series-connected installations, each having an inductance and an initially charged capacitor which are switchable on the said charge to form, respectively, oscillating circuits.

6 Claims, 1 Drawing Figure

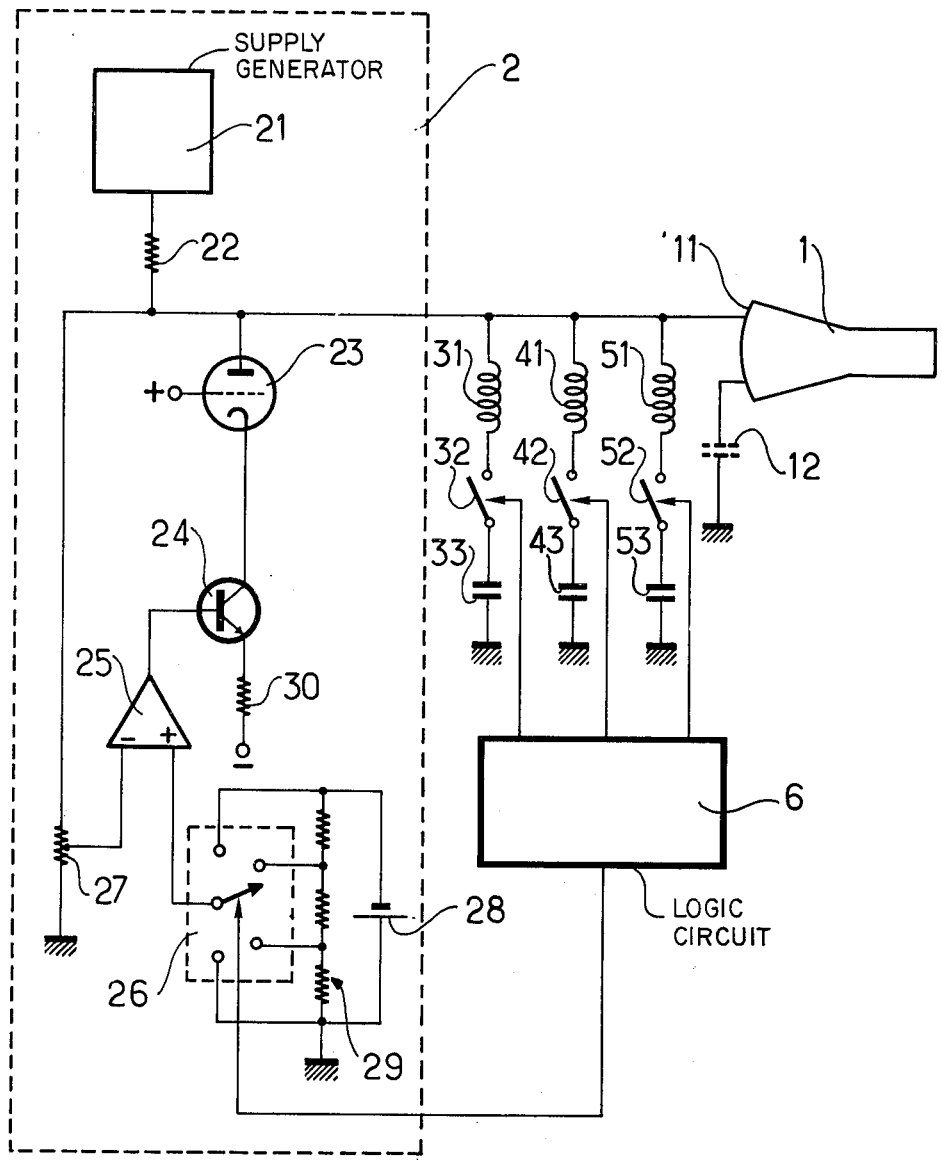

HIGH VOLTAGE RAPID SWITCHING CIRCUIT

The present invention concerns a high-voltage rapid switching circuit, more particularly for the applying of acceleration voltages having different values to the electron beam of a polychromatic display cathode tube.

In polychromatic tubes, of the variable penetration type, the cathode screen is provided with two superimposed luminescent layers. The first layer which undergoes directly the impact of the electron beam gives a red light radiation; the second layer which is separated from the first by a substance forming a potential barrier, gives a green light radiation at the time of the impact of the electron beam. It is a known method to effect the controlling of the display color by affecting the acceleration voltage of the electron beam meeting successively these two luminescent layers. Thus, if the electron beam is accelerated at a voltage of 6 kV, for example, the electrons stop in the first layer and excite exclusively the red luminescence. The second luminescent layer separated from the first by the potential barrier is not reached, so that it is not, or practically not, energized by that acceleration voltage. If, on the other hand, the acceleration voltage of the electron beam is brought to 14 kV, for example, the penetration of the electrons increases. They cross the potential barrier and energize greatly the second layer giving a green luminescence. In that case, the first layer is very slightly energized — only a green spot at the impact point of the electron beam appears on the screen.

A deflection of the electron beam and a switching of its acceleration enable green or red traces or traces of intermediated colors obtained for the intermediate values of the acceleration voltage to appear on the screen of the cathode tube.

That acceleration voltage is applied to the screen of the tube, the cathode of the electron gun being earthed. Now, the screen, which must compulsorily be conductive, to avoid the forming of a space charge at the time of the electron bombardment, has a great parasite capacity, in the order of 200 to 400 pF, in relation to the earthed protections of the tube. Consequently, each switching of the acceleration voltage, from a first value to a second, requires the charge or discharge of that capacity, that is, a generating of current intended to provide the alternate charge or discharge component of that capacity.

Moreover, it is known that acceleration voltage switching circuits must have switching times which are as short as possible with a view to not reducing excessively the representation capacity of the system.

With a view to meeting these requirements, there is a known switching circuit, described in U.S. Pat. No. 3,697,880 of Oct. 10, 1972, in the applicant's name, in which a switchable voltage generator, suitable for applying to the screen the required acceleration voltage values, is combined in a circuit providing a supplement of reactive power necessary for the rapid charge or rapid discharge of that screen capacity. For switching between two acceleration voltage values, that supplement of reactive power is obtained through two transformers fed by a pulse generator and whose secondary windings are arranged, each in series with a rectifier and a switching source, between the screen and the earth, to form a charge branch circuit and a discharge branch circuit for the capacity of the screen. The pulse generator is itself controlled by the said switchable voltage generator, with a view to applying, at the time of a switching from the lowest of these screen potentials to the highest, a pulse to the charge branch circuit of the screen capacity and, at the time of a switching from the highest of these potentials to the lowest, a pulse to the discharge branch circuit of the screen capacity.

Nevertheless, that switching circuit has a disadvantage due to the fact that the alternate supplementary energy supplied at each switching, not being recuperated, is dissipated in the switching sources necessary for the blocking of the rectifiers respectively connected together when the charge and discharge branch circuits are at rest, that is, once the supplement of energy is transmitted. This dissipating of energy in the switching sources causes the heating thereof and has the consequence of limiting the frequency of the switching operations.

The aim of the present invention is to produce a rapid switching circuit avoiding, moreover, the latter disadvantage.

The present invention has for its object a high-voltage rapid switching circuit for switching, between $n$ different levels, the voltage at the terminals of a charge having a capacity in relation to the electric mass, comprising a switchable voltage generator, suitable for forming the $n$ preset electric potential levels, characterized in that it comprises, moreover, at least $n-1$ switchable oscillating circuits comprising, on the one hand, in common, the said capacity set to a determined original potential and on the other hand, a series-connected circuit, each connected to the terminals of the said charge and comprising an inductance, a controlled switch and a starting up source for switching, constituted by a charged capacitor, whose original state is preset, to set the potential at the terminals of the said charge, from the said determined original potential to one of the said $n$ levels at the time of the closing of said switch during a half cycle of the said corresponding oscillating circuit.

Other characteristics and the advantages of the present invention will become apparent from the following description given hereinafter with reference to the accompanying drawing in which the single FIGURE shows an example of the implementing of the circuit according to the invention.

The circuit shown in that FIGURE is intended to supply the acceleration voltage of the electron beam of a polychromatic display cathode tube. That display tube is designated by the reference 1. The electron beam positive acceleration potential is applied to the screen 11 of that tube 1. The cathode of the electron gun has not been shown; it is brought to the potential of the electric mass. The screen 11 has, in relation to the electric mass, an interference capacity C, represented by a capacitor 12 which is earthed.

The acceleration voltage applied to the screen 11 of the tube 1 is provided by a switchable high-voltage generator 2, of known type, connected to the screen 11 and suitable for applying to the said screen n required values of acceleration voltage, either, for example, 6, 9, 12 or 14 kV for the displaying of traces in red, orange, yellow or green. A general illustration of the embodiment of that switchable voltage generator is given in that FIGURE. It comprises on the one hand a supply generator 21 providing a continuous voltage, for example of 21 kV and, on the other hand, a combined servocontrolled regulator. That regulator is constituted, as diagrammatically shown, by a charge resistor 22 connecting the supply generator 21 to the screen 11 of the tube 1 whose current crossing it is controlled by a vacuum triode 23, connected to a transistor 24. The anode of the triode 23 is connected to the screen 11 of the tube 1 and to the charge resistor 22. The cathode is connected to the collector of the transistor 24 and its grid is brought to a positive potential, for example, +24 V. The emitter of the transistor 24 is connected up through a polarization resistor 30 to a fixed potential, for example, −24 V. The base of the transistor 24 is set to a control potential sent out by a saturable differential amplifier 25 receiving on its positive input terminal a switchable reference potential, by the controlling of an electronic switch 26, between four values and, on its negative input terminal, the potential coming from a resistive bridge 27 connected up between the earth and the screen 11 of the tube 1. The circuit supplying the switchable reference potential is diagrammatically shown by a source 28 at whose terminals is installed a resistive divider 29 with which the switch 26 cooperates. In that FIGURE that switch 26 is represented as the mechanical type of switch; it cooperates with the four connections of the resisitve divider 29. Such a circuit enables, by the controlling of the transistor 24, the controlling of the current crossing the charge resistor 22 and hence the potential drop through that resistor, that is, finally, the potential applied to the screen 11.

That switchable voltage generator 2 is combined with a starting up circuit intended for accelerating the charge or discharge of the screen 11 with a view to bringing it in a very short time to the required potential, the generator 2 having a time constant conditioned by the values of the resistor 22 and of the interference capacity 12, which is too great.

That starting up circuit is constituted by at least three branch circuits connected up in parallel to the capacity 12 and being switchable to form each, with the capacity 12, an oscillating circuit. These three branch circuits are similar: they each comprise, in series, an inductance 31, 41, or 51, a controlled switch 32, 42 or 52 of which the mechanical form is shown and a starting up source formed by a charged capacitor 33, 43 or 53. Each of these series assemblies is installed between the screen 11 and the earth. Regulated sources, not shown, will be, for example, combined with the capacitors 33, 43 and 53 with a view to charging them properly before the putting into service of the circuit. A logic circuit 6, not shown in detail, ensures the controlling (of the closing) of the switch 26 in one of the positions diagrammatically shown as well as the corresponding controlling of the switches 32, 42 and 52 as will be explained hereinafter.

In this embodiment, at the time of closing of one of the switches, the switch 42, for example, the elements 43, 41 and 12 form an oscillating circuit having a cycle of $$T_2 = 2\pi \sqrt{L_2 \frac{CC_2}{C+C_2}}$$

$L2$ and $C2$ being the values of the inductance 41 and of the capacity 43, $C$ being the value of the capacity 12.

In that oscillating circuit, there is an exchange of charges between the two capacitors 43 and 12 at the end of the first half-cycle of oscillation for which the current is nil in the switch 42. The reverse exchange of charges, bringing each of the capacitors 43 and 12 back to their original state, takes place at the end of the second half-cycle. The voltage at the terminals of the capacity 12 may thus be switched from an original value $U_o$ to a value $U_2$ at the end of the first alternance and from the original value $U_o$ at the end of the second alternance, by a simple exchange of charges between the capacity 12 and the starting up source 43 which is connected with it in the oscillating circuit formed.

This installation comprising three switchable oscillating circuits enables a rapid switching of the electron beam accelerating voltage between four different levels, one of the levels being defined by the original voltage applied to the screen 11 of the tube, that is, to the capacity 12 of the screen.

The switching of the electron beam acceleration voltage may thus be effected between four levels, the level $U_o$ applied to the screen and defining the original state of charge of the capacity 12 and one of the levels $U_1$, $U_2$, and $U_3$ obtained, respectively, at the time of the closing of one of the switches 32, 42 and 52, during a half-cycle of the oscillating circuit between the capacity 12 and the corresponding starting up capacitor 33, 43 or 53. The original charge state of each of the capacitors 33, 43 and 53 is chosen taking into account the original state $U_o$ of the capacity 12 and of the values of the capacity 12 and of the capacity of each of the capacitor 33, 43 and 53.

During operation, the switching of the acceleration voltage from a first value, for example, $U_1$, to a second value, for example $U_2$, is effected passing back through the value $U_o$ of the original state of the capacity 12. In that example, the switching from $U_1$ to $U_o$ is obtained by the closing of the switch 32 during a half-cycle of the oscillating circuit 12, 31 to 33, bringing the state of the capacity 12 of the value $U_1$ back to the original state $U_o$, then by closing of the switch 42 during a half-cycle of the oscillating circuit thus formed 12, 41 to 43, bringing the state of the capacity 12 from the original value $U_o$ to $U_2$.

The switching control means, at the time of a change in the color of the traces are provided by the logic circuit 6, which, on the one hand, sets the switch 26 in the required position and, on the other hand, temporarily closes two of the switches 32, 42, 52 in succession, with a view to enabling the rapid setting of the capacity 12 to the required new charge state, passing through the original state $U_o$ chosen as a reference state. In that case a memory is comprised in the logic circuit 6 with a view to keeping the data of the preceding color of the traces. That data is used therefor for bringing the capacity 12 back to the original charge state $U_o$, chosen as a reference, in a half-cycle of oscillation of the corresponding oscillating circuit, by the closing of the last switch (32, 42, 52) to have been actuated. Although the logic control circuit 6 has not been shown, it will be understood that if the state of charge of the capacity 12 is $U_o$ before or after a change in color, only one of the switches 32, 42, 52 will be actuated. In all other cases, two switches will be actuated successively.

With a view to producing exchanges of charges between capacitors 12, 33, 43, 53 which are relatively low, it is possible, as a variant of operation, to control the exchanges of charges between the capacity 12 and the capacitors 33, 43, 53 exclusively by a jump to the value directly above or below. Thus, the original state of charge of the capacity 12 being $U_o$ ($U_1 < U_o < U_2 < U_3$) the state of charge of the capacity may be brought from $U_o$ to $U_1$ by the transitory closing of the switch 32, from $U_o$ to $U_2$ by the transitory closing of the switch 42, from $U_o$ to $U_3$ by the transitory closing of the switch 42, then of the switch 52. Similarly, the charge state of the capacity 12 having the value $U_1$ in order to make the state of the capacity changeover from $U_1$ to $U_3$, the switch 32 (capacity 12 at $U_o$), the switch 42 (capacity 12 at $U_2$) and the switch 52 (capacity 12 at $U_2$) and the switch 52 (capacity 12 at $U_3$), will be successively actuated. The logic circuit 6 will shut off very temporarily the switches 32, 42, 52, one after another and in a determined order by the reference configuration of the charge states of the capacitors 33, 43, 53 to obtain a modification by jumps of the state of charge of the capacity 12 from its value to another value.

In that switching circuit, all dissipation of energy is avoided. Indeed, the alternate energy supplied, for the charge or the discharge of the capacity 12 by one or the other of the starting up sources, is recuperated by the capacity 12 (at the time of its charge) or by the starting up source (at the time of the discharge of the capacity 12) whereas the reverse transfer of the charges bringing the capacity 12 back to its original value $U_o$ has the effect of brining back, also, the starting up source considered to its original state.

It must be understood that the complete absence of dissipation is theoretical and in practice, slight leakages occur in the capacities and the choke coil. The effects of these leakages, which are slight in relation to the alternate energy supplied for the rapid charge or discharge of the capacity 12 have no practical influence on the frequency of the switching operations. They have, as a direct effect, the slight modifying of the original charge state of the elements of the circuit. These losses are compensated by the source 2 or the regulated sources for starting up the charge of the capacitors 33, 43 and 53, not shown in that circuit.

In practice, the switches 32, 42 and 52 of which the mechanical version is shown, will be of the electronic type. Their only characteristics in that application is that they bear a high voltage under vacuum, in the order of 4 kV, that they may be primed and unprimed rapidly in order to pass respectively to the conductive state and to the blocked state, the unpriming thereof possibly being automatic at the end of a half-cycle of oscillation of the corresponding oscillating circuits at the end of which the current is canceled. Circuits for such switches, operating on a "hit-or-miss" basis, without dissipation of energy, without bearing over-voltages on the blocking thereof (current nil) and not required to ensure the cutting of the current, being known per se, the embodiment thereof is not shown in detail in the figure.

The high voltage switching device described supplies the alternate component of the current in the screen 11 of the tube enabling the rapid charge or discharge thereof. It must be understood that the active component of the current in the screen 11 is supplied from the regulated continuous source 2. The essential advantages derived from the use of that switching circuit reside in its simplicity, its rapidity of operation and the high frequency of possible switching operations.

By way of an example, the dimensioning of the elements of the oscillating circuits will be chosen as follows. The interference capacity 12 being 300 pF, the capacitors 33, 43 and 53 will each have a capacity of 600 pF and the choke coils 31, 41 and 51 will have an inductance of 0.01 H. The high voltage switching operations being effected between 6, 9, 12 and 14 kV, at the original state of the capacity 12 will be brought to 9 kV and the capacitors 33, 43 and 53 will be brought to 6.75, 11.25 and 12.75 kV, respectively. For that installation, the oscillation cycle is then in the order of $9\mu s$.

The present invention has been described with reference to a particular embodiment shown in the figure. It is evident that without going beyond the scope of this invention, details may be modified and/or certain means may be replaced by other equivalent means. It will be observed, more particularly, that the choke coils 31, 41 and 51 may be replaced by a single chock coil forming a part of the three oscillating circuits.

What is claimed is:

1. A high voltage rapid switching circuit for switching a voltage applied to a charged element having a particular electrical capacity between n different levels comprising switchable voltage generator means connected to said charged element for supplying n levels of d.c. high voltage, starting-up circuit means for connection to said charged element to form at least one oscillating circuit therewith for switching the potential of said charged element with respect to ground to one of said n levels of d.c. high voltage, and logic circuit means for controlling said switchable voltage generator means and said starting-up circuit means to the same of said n levels of d.c. high voltage.

2. A high voltage rapid switching circuit as defined in claim 1 wherein said starting-up circuit means comprises a plurality of series-connected circuits connected to said charged element, each series-connected circuit including an inductance, a switch and a starting-up voltage source in the form of a precharged capacitor, the switch in each series-connected circuit being controlled by said logic circuit means.

3. A high voltage rapid switching circuit as defined in claim 2 wherein said switchable voltage generator means comprises a d.c. high voltage source, a resistor connecting said high voltage source to said charged element and an oscillating circuit switchable to n-1 frequencies by said logic circuit means connected to the point between said resistor and said charged element.

4. A high voltage rapid switching circuit as defined in claim 3 wherein said oscillating circuit comprises an operational amplifier and means for varying the frequency of the output of said operational amplifier in response to said logic circuit means.

5. A high voltage rapid switching circuit as defined in claim 3 wherein said charged element is set to an original potential equal to one of said n levels of d.c. high voltage.

6. A high voltage rapid switching circuit as defined in claim 1 wherein said starting-up circuit means comprises an inductance element connected to said charged element and a plurality of series-connected circuits connected to said inductance element, each series-connected circuit including a switch and a starting-up voltage source in the form of a precharged capacitor, the switches being controlled by said logic circuit means.

* * * * *